United States Patent [19]

Yester, Jr. et al.

[11] Patent Number: 4,811,362
[45] Date of Patent: Mar. 7, 1989

[54] LOW POWER DIGITAL RECEIVER

[75] Inventors: Francis R. Yester, Jr., Arlington Heights; William J. Turney, Schaumburg; Paul H. Gailus, Prospect Heights, all of Ill.

[73] Assignee: Motorola, Inc., Schaumburg, Ill.

[21] Appl. No.: 62,816

[22] Filed: Jun. 15, 1987

[51] Int. Cl.$^4$ .......................................... H04L 27/06
[52] U.S. Cl. ....................................... 375/75; 375/94; 455/343
[58] Field of Search .................. 375/75, 80, 96, 99; 455/31, 36, 343; 340/331, 311; 329/104

[56] References Cited

U.S. PATENT DOCUMENTS

| | | | |
|---|---|---|---|
| 3,651,413 | 3/1972 | Wycoff | 455/36 |
| 3,979,701 | 9/1976 | Tomozawa | 333/70 T |
| 3,988,539 | 10/1976 | Motley et al. | 178/67 |
| 4,003,002 | 1/1977 | Snijders et al. | 332/10 |
| 4,011,438 | 3/1977 | Aufderheide et al. | 235/152 |
| 4,057,759 | 11/1977 | Genova et al. | 325/320 |
| 4,062,060 | 12/1977 | Nussbaumer | 364/724 |
| 4,071,821 | 1/1978 | Harthill et al. | 324/83 |
| 4,130,806 | 12/1978 | Van Gerwen et al. | 325/487 |
| 4,159,526 | 6/1979 | Mosley, Jr. et al. | 364/721 |
| 4,237,554 | 12/1980 | Gitlin et al. | 375/15 |
| 4,246,653 | 1/1981 | Malm | 375/82 |
| 4,313,211 | 1/1982 | Leland | 455/139 |
| 4,315,219 | 2/1982 | Rocheleau et al. | 328/14 |
| 4,345,500 | 8/1982 | Alonso et al. | 84/1.01 |
| 4,346,477 | 8/1982 | Gordy | 455/257 |
| 4,356,559 | 10/1982 | Candy et al. | 364/724 |
| 4,384,357 | 5/1983 | DeBuda et al. | 329/81 |
| 4,384,361 | 5/1983 | Masaki | 455/343 |
| 4,419,759 | 12/1983 | Poklemba | 375/97 |
| 4,455,680 | 6/1984 | Villarreal et al. | 455/208 |
| 4,475,220 | 10/1984 | Mattei et al. | 375/86 |
| 4,479,261 | 10/1984 | Oda et al. | 455/343 |
| 4,506,228 | 3/1985 | Kammeyer | 329/107 |
| 4,531,237 | 7/1985 | Bar-on et al. | 455/343 |
| 4,590,618 | 5/1986 | Heath et al. | 455/343 |

FOREIGN PATENT DOCUMENTS 2081047 2/1982 United Kingdom .

OTHER PUBLICATIONS

Yiu et al., A Low-Cost GPS Land Receiver for Land Navigation, Journal of the Institute of Navigation, vol. 29, No. 3, Fall 1982.

Bellanger et al., Digital Filtering by Polyphase Network: Application to Sample-Rate Alteration and Filter Banks, IEEE Trans. on Acoustics, Speech, and Signal Processing, vol. ASSP-24, No. 2, Apr. 1976.

Tierney et al., A Digital Frequency Synthesizer, IEEE Trans. on Audio and Electroacoustics, vol. AV-19, No. 1, Mar. 1971.

Stephenson, Digitizing Multiple of Signals Requires an Optimum Sampling Rate, Electronics, pp. 106–110, Mar. 27, 1972.

Agarwal et al., New Recursive Digital Filter Structures Having Very Low Sensitivity and Roundoff Noise, IEEE Trans. on Circuits and Systems, vol. CAS-22, No. 12, Sec. 19.

Bruton, Low Sensitivity Digital Ladder Filters, IEEE Trans. on Circuits and Systems, vol. CAS-22, No. 3, Mar. 1975.

Chao, Low Cost RF/LSI Technologies for Commerical GPS Receivers, Microwave Systems App. Technology Conf., Wash., D.C., Mar. 1983.

*Primary Examiner*—Benedict V. Safourek
*Assistant Examiner*—Stephen Chin
*Attorney, Agent, or Firm*—Thomas G. Berry; Jose W. Jimenez

[57] ABSTRACT

A low power digital receiver (10) is provided that contemporaneously selects the lowest possible sampling signal frequency (34) (from a plurality of available sampling signals), and received signal level (28) to properly digitize (32) and recover a desired signal. Digitization is performed after the first IF using broadband stages (28, 30, and 32) that are temporarily enabled (44) to rapidly digitize the first IF signal. This, together with the low sampling rate, minimizes the power consumption of the receiver (10) thereby permitting portable and mobile digital receiver embodiments.

9 Claims, 1 Drawing Sheet

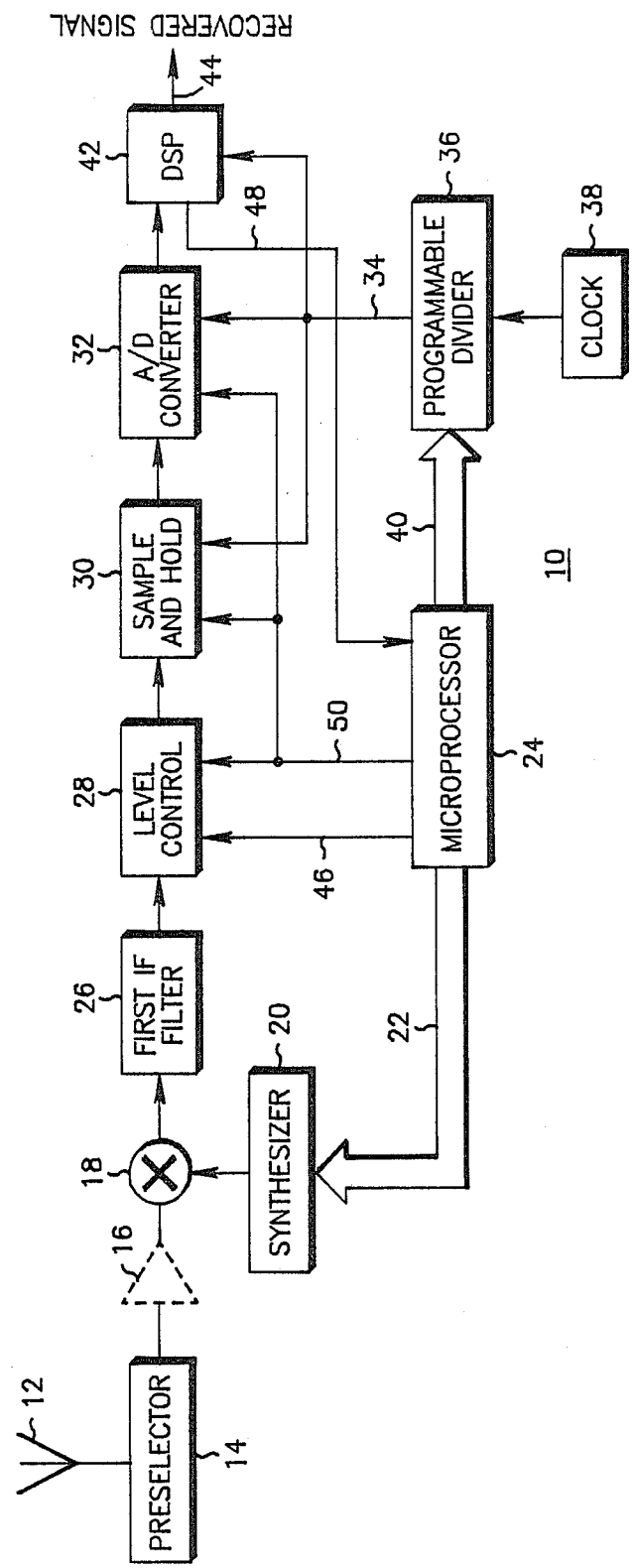

LOW POWER DIGITAL RECEIVER

TECHNICAL FIELD

This invention relates generally to digital receivers and more particularly to digital receivers requiring low power consumption, such as mobile or portable digital receivers.

BACKGROUND ART

Digital receivers are known. Proponents of digital receivers typically cite their immunity from operational variations due to temperature, humidity, and component aging as the primary advantages over their analog receiver counterparts. The primary technological advance that has spurred development of digital receivers is the Digital Signal Processor (DSP). DSPs are readily programmable to perform many combined functions and features. For example, a digital intermediate frequency (IF) filter may be made programmable in terms of channel frequency, sampling rate, and the desired filter response. Additionally, a DSP, executing alternately stored programs, may perform many different types of filtering and demodulation to implement completely different types of receivers. Further, DSPs facilitate miniaturization since, in one (or a few) Large Scale Integrated (LSI) packages, many analogous analog functions may be performed.

To obtain the maximum benefit from the use of digital technology, most digital receiver designers strive to digitize a received signal as soon as possible, preferably, before the first mixer and IF. However, the bandwidth in these early stages of a typical receiver require extremely high sampling rates to properly digitize the received signal in accordance with the Nyquist theorem. For example, a receiver having a 30 MHz "front end", would require a sampling rate in excess of 60 MHz. The circuits and components used to digitize a received signal at extreme rates consume tremendous amounts of power so as to render a portable receiver implementation, and to a certain extent a mobile receiver implementation, impossible or impractical due to the unacceptably high current drain on the battery. As used herein, a mobile receiver is a receiver designed to be installed in a vehicle, and a portable receiver is a receiver designed to be carried on or about the person.

Accordingly, some digital receiver designers opt to digitize the received signal in the "back end" of the receiver, which is generally understood to be after the IF selectivity. Since the bandwidth and dynamic range requirements of these later stages are reduced, the sampling rate may be lowered to conserve power consumption. Generally, this eases the burden of providing a mobile receiver, however, advantageous DSP and receiver design techniques such as varying the IF bandwidth and filter shape are prohibited. Accordingly, a need exists to provide a digital receiver that operates in the mobile and portable environments.

SUMMARY OF THE INVENTION

Accordingly, it is an object of the present invention to provide a low power digital receiver.

It is a further object of the resent invention to provide a low power digital receiver that may be used in a mobile or portable implementation.

It is another object of the present invention to provide a digital receiver having a plurality of sampling signals to digitize a received signal.

It is yet a further object of the present invention to provide a digital receiver that dynamically adapts the sampling rate by selecting a particular one of the sampling signals to conserve power consumption.

Briefly, according to the invention, a digital receiver is provided by digitizing after a first IF stage. A plurality of sampling signals are generated to digitize the received signal. According to the characteristics of the received signal, the sampling signal which provides the lowest acceptable sampling rate is selected to minimize power consumption. Contemporaneously, the received signal level is adjusted to maintain constant sensitivity. The digitization circuits are selectively enabled to digitize and process the received signal to provide a recovered signal, and returned to a low power (or no power) state to further conserve power consumption.

BRIEF DESCRIPTION OF THE DRAWINGS

The features of the present invention which are believed to be novel are set forth with particularity in the appended claims. The invention, together with further objects and advantages thereof, may be understood by reference to the following description, taken in conjunction with the drawing figure, which comprises a block diagram of the preferred embodiment of the present invention.

DETAILED DESCRIPTION OF THE PREFERRED EMBODIMENT

Referring now to the drawing figure, the digital receiver 10 of the present invention is shown. The receiver 10 operates to receive radio frequency (RF) signals via an antenna 12, which is coupled to a preselector filter 14. The preselector filter 14 may be any suitable filter, such as a helical filter, which appropriately bandlimits the frequency spectrum to a predetermined frequency band of interest. Generally, in contemporary receivers, typical preselector filter bandwidths are in the 20-30 MHz range. After filtering, the bandlimited received signal may be optionally amplified in an RF amplifier 16 prior to entering the mixer 18. The mixer 18 may be of conventional design and operates to down-convert the bandlimited received signal to a predetermined IF stage. As a second input, the mixer 18 accepts a local oscillator (LO) signal, which is preferably generated by a frequency synthesizer 20, and which may be a variable synthesizer programmed (22) by a microprocessor 24 or other suitable control device.

The down-converted IF signal from the mixer 18 is received by a first IF filter 26, which preferably is a crystal filter. Those skilled in the art will appreciate that to provide a low power digital receiver, the sampling rate must be reduced. Generally, there are two limiting factors that prevent the sampling rate from being lowered. The first of these factors is the occupied bandwidth of the desired signal. The wider the occupied bandwidth, the higher the required sampling rate to properly sample the signal. Accordingly, a narrow bandwidth crystal filter would reduce the required sampling rate, and thus, the power consumption. Further, as a general rule, receiver designers prefer as narrow an IF as possible to improve adjacent channel desensitization (desense) and intermodulation (IM) performance. Moreover, it is common knowledge that broadening the IF bandwidth introduces additional noise into the IF thereby degrading the receiver's performance. However, the present invention departs from these recognized principles and prefers a first IF filter 26 that has a significantly broader bandwidth than would otherwise be. required to properly recover the desired signal(s). Accordingly, since the current land mobile RF standard comprises a channel having a 12 kHz bandwidth, the first IF filter 26 preferably has a bandwidth in the 30-50 kHz range. For other channel standards, a proportional bandwidth scaling would be acceptable. The sharp "skirts" of the crystal filter (26) afford a balance of competing design factors by controlling image response, while the wider bandwidth contemporaneously allows for temperature, humidity, and production tolerance variations. In this way, the present receiver's broadband characteristics, such as IM, desense, and spurious frequency response, are controlled, while allowing a DSP (42) to control the receiver's close-in performance.

The filtered first IF signal is received by a level control circuit 28 that variably adjusts the level of the first IF signal in such a way as to facilitate digitization, as will hereinafter be fully described. The level control circuit 28 may be of conventional design and preferably comprises a programmable attenuator and low-noise amplifier. The first IF signal, after being amplified or attenuated, is coupled to a sample-and-hold device 30, which provides analog samples to the analog-to-digtial (A/D) convertor 32 at a rate determined by a sampling signal 34. The sample-and-hold device 30 is preferably of the harmonic type, which multiplies a selected harmonic of the sampling signal by the first IF signal such that its analog output samples comprise the second IF signal, which has a preferred frequency of approximately one-fourth ($\frac{1}{4}$th) of the frequency of the sampling signal 34. That is, the sampling rate ($f_s$) present invention always satisfies:

$$f_s = \text{intermediate frequency } (M \pm 0.25) \quad (1)$$

Where M is an integer value representing the selected harmonic used in the sample-and-hold device 30.

Desense performance comprises a key specification in any receiver design. In an analog implementation, a receiver's desense performance is determined primarily by the side-band noise of the LO. Typically, desense is caused by a large (i.e., high amplitude) adjacent channel interfering signal mixing with the LO's side-band noise one channel away from the IF of the receiver. This operates to produce a second order mixing product that resides exactly in the IF of the receiver thereby increasing the received noise and reducing the sensitivity to the desired signal. The resulting on-channel noise power produced by this second order mixing process increases in direct proportion with either the signal strength of the interfering signal (in db) or the level of the LO's side-band noise. Therefore, LO sideband noise must be controlled to obtain acceptable desense performance in any analog receiver. Accordingly, since the front end of the receiver of the present invention comprises an analog implementation, the desense performance will be determined in large part by the side-band noise of the LO (20).

In digital receivers there is an additional cause of desense. As is known to those skilled in the art, if the signal samples have an excessive amplitude, the A/D convertor 32 will "clip". When an A/D clips, it produces a fixed output digital "word" irrespective of whether the input is varying. Thus, A/D clipping causes unacceptable noise and distortion in the recovered signal. Therefore, generally, the A/D must be prevented from clipping. To prevent an A/D convertor from clipping, a large received signal may be attenuated However, as is known in the art, attenuating a signal generally degrades a receiver's noise-figure. Generally, a degraded noise-figure caused by large undesired signals reduces the receiver's sensitivity to the desired signal in a manner similar to desense. Nevertheless, the receiver of the present invention varies the receiver's desense performance by suitably controlling (46) the level of the first IF signal to prohibit the A/D 32 from clipping.

The second major limitation upon sample rate reduction is A/D convertor noise. As is known, the A/D 32 quantizes the sampled first IF signal at a rate determined by the sampling signal 34. Generally, the noise-figure of an A/D convertor is quite poor. Further, the A/D's noise-figure varies as the sampling rate changes. Therefore, sampling rates in prior receivers have been fixed to avoid a receiver having a changing noise-figure. Additionally, it is generally accepted design practice to include an initial low-noise amplifier to improve the overall receiver noise-figure. However, increasing the gain before the A/D converter tends to degrade a receiver's intermodualation (IM) performance. Like desense, IM typically degrades a receiver's senstitivity to the desired signal in the presence of a large undesired signal. IM is a third order phenomenon wherein an interfering signal residing one channel away from the desired signal has its frequency doubled, and is mixed with a second interfering signal residing two channels away from the desired signal, to produce an interfering on-channel signal. The interfering on-channel noise power will increase 2:1 (in db) with an increase in the interfering signal one channel away, and directly proportional to the interfering signal (in db) two channels away from the desired signal. Since gain increases the amplitude of both these interfering signals, the IM performance of the receiver will degrade.

As previously mentioned, the receiver of the present invention contemplates a varying level control 28 as opposed to the fixed low-noise amplifiers of the past. Also, the present receiver operates to dynamically vary the sampling rate (34) to reduce power consumption. Accordingly, it would be expected that the receiver's noise-figure, desense and IM performance, and sensitivity to the desired signal will vary. Generally, this is considered undesirable. However, the present invention is designed to operate to contemporaneously vary (46) the level control circuit 28 with a sampling rate change. By contemporaneously varying the received signal level with a sampling change, a floor is set on the receiver's sensitivity. By setting the floor to an acceptable level, the sampling rate may be varied to reduce power consumption without adversely affecting the receiver's performance.

The reason this contemporaneous level and sampling rate change operates to produce the advantageous floor setting is that the in-band noise generated by the A/D convertor 32 is reduced by 3 dB for every doubling of the sampling rate. Therefore, in general, as between two sampling rates, the amplitude of the desired signal may be reduced at the higher sampling rate by:

$$10 \log (\text{high rate})/(\text{low rate}) \quad (2)$$

Thus, for example, if the sampling rate were increased from 0.96 MHz to 62.4 MHz, the in-band noise would decrease by 18 dB. Accordingly, the level control circuit 28 operates to decease the level of the desired signal by 18 dB at 62.4 MHz to insure constant receiver sensitivity. Additionally, as previously mentioned, this gain reduction has the added benefit of improving the receiver's IM and desense performance. Accordingly, the present invention contemplates that the level control circuit 28 may attenuate the desired signal (irrespective of the fact that conventional wisdom would indicate that the receiver's noise-figure would be degraded), contemporaneously with a change in sampling rates, to provide a constant (floor) receiver sensitivity.

Preferably, the present invention operates to dynamically adapt to changing conditions to select the lowest acceptable sampling rate, from a plurality of sampling rates, thereby minimizing power dissipation. According to the present invention, the sampling signal 34 is generated by dividing (36) a clock source 38. The plurality of sampling signals may be generated by programming (40) the divider 36. By dividing the single clock source 38, the present invention allows for synchronous switching between sampling signals, without temporary loss of the recovered signal. In the preferred embodiment, three sampling signals comprise the universe of allowable sampling signals. The highest sampling signal has a frequency of 62.4 MHz, a second sampling signal has a frequency of 4.8 MHz, and the lowest sampling signal has a frequency of 0.96 MHz. The selected (programmed) sampling signal 34 is coupled to the sample and hold device 30, the A/D 32, and a DSP 42 such that these devices operate synchronously. Predominately, the receiver 10 operates using the lowest sampling signal, the frequency of which is selected to provide image protection by considering the bandwidth of the crystal filter 26. Of course, the Nyquist requirements must be met. The higher sampling rates, together with their contemporaneous lower gain levels, are selected when interference threatens to compromise the receiver's desense or IM performance.

In the preferred embodiment, the level control circuit 28, the sample and hold device 30, and the A/D 32 have very wide operational bandwidths compared to the desired recovered signal 44. Preferably, the bandwidth of these devices would be on the order of 500 MHz. As is known, devices with wider bandwidths operate faster (i.e., may be turned on and off rapidly and may operate at higher frequencies) However, such devices consume greater amounts of current and introduce more noise than their narrow-band counterparts. Nevertheless, the present invention prefers wide-band high-current devices that are rapidly enabled and disabled via a power cycling control line 50. Preferably, the level control circuit 28, the sample and hold device 30, and the A/D 32 operate at approximately 62.4 MHz (i.e., they have a cycle time of approximately 16 ns). Therefore, these devices may be enabled (44) to operate at full current, sample the first IF signal using, for example, the 0.96 MHz sampling signal in approximately 16 ns, and the be powered down for the remainder of the approximately 1 μs normal sampling period. By this arrangement, the present invention achieves improved IM performance since these devices operate at full current for a short period of time. Conversely, operating low-speed devices at lower currents over the entire sampling period degrade IM performance since they operate at lower currents during the sampling period. Those of ordinary skill understand that a device operating at high currents has superior dynamic range compared to low-current operation. Thus, the present invention operates briefly at maximum dynamic range (albeit high power) during the time required to sample the received signal, after which the low-current (or no-current) dynamic range or IM of the devices is irrelevant, since sampling has been completed. Accordingly, the level control circuit 28, the sample and hold device 30, and the A/D 32 are rapidly enabled to operate at full current for only that portion of time necessary to sample the first IF signal (with the selected sampling signal), and thereafter, these devices are rapidly disabled (i.e., turned off or placed in a low power state) until the next sampling interval. Thus, by operating faster devices at full current for a short period of time, the present invention achieves superior IM performance than digital receivers employing slower narrowband devices designed for reduced current drain, or analog receivers having continuously operating IF stages.

As noted earlier, the sample and hold device 30 provides analog output samples comprising the second IF signal. Preferably, the second IF frequency is approximately one-fourth ($\frac{1}{4}$th) of the frequency of the sampling signal 34 (see equation (1)). Thus, for example, if the first IF frequency was 109.2 MHz, and the sampling frequency was 62.4 MHz, the sample and hold device 30 may mix the second (2nd) harmonic of 62.4 MHz (124.8 MHz) with 109.2 MHz to produce a second IF frequency of 15.6 MHZ (i.e., 124.8–109.2), which is one-fourth of 62.4 MHz (i.e., 62.4/4). However, if the sampling frequency was 4.8 MHz, the sample and hold device 30 may mix the twenty third (23rd) harmonic of 4.8 MHz (110.4 MHz) with 109.2 MHz to produce a second IF frequency of 1.2 MHZ (i.e., 110.4–109.2), which is one-fourth of 4.8 MHz (i.e., 4.8/4). Lastly, if the lowest sampling frequency of 0.96 MHz is selected, the sample and hold device 30 may mix the 114th harmonic of the 0.96 MHz (i.e., 109.44 MHz) with 109.2 MHz to produce a second IF frequency of 0.24 MHz (i.e., 109.44–109.2), which is one-fourth ($\frac{1}{4}$) of 0.96 MHz (i.e., 0.96/4).

The DSP 42 is programmed to provide the digital second IF filtering and to perform all demodulation functions such that the DSP provides a recovered signal 44 at its output. Preferably, the DSP 42 is a DSP56000, manufactured by Motorola, Inc., or its functional equivalent. Of course, the recovered signal 44 is in digital form and would be processed by a digital-to-analog (D/A) convertor and other analog audio circuits (not shown) prior to being heard by the receiver operator.

Additionally, the DSP 42 determines when to adapt the sampling rate. The DSP 42 receives the quantized output codes of the A/D 32. As the A/D approaches the clipping point, the output codes approach a predetermined maximum value. Thus, the DSP 42 compares the digital samples against the known maximum and asserts a signal (48) to the microprocessor 24 if a change of sampling signals is required. The microprocessor 24 reprograms (40) the divider 36 to provide a higher frequency sampling signal, and contemporaneously adjusts (46) the level control circuit 28 to reduce the received signal level. Conversely, the receiver 10 operates to return to a lower frequency sampling signal (and higher received signal level) as soon as the DSP 42 determines that the interference has subsided.

In summary, a low power digital receiver is provided that selects the lowest possible sampling signal (from a plurality of available sampling signals) to properly digitize and recover a desired signal. Digitization is performed after the first IF using broadband stages that are temporarily enabled to rapidly digitize the first IF signal. The sampling rate and received signal level are dynamically and contemporaneously varied when the low power digital receiver of the present invention roams into a high interference area. According to the present invention, the receiver's sensitivity is constant regardless of the sampling rate, while providing an adequate (floor) desense and IM performance is maintained. The lowest acceptable sampling rate is selected to minimizing the power dissipation of the receiver. Since the sampling signals are generated from a common source, the sampling rate may be varied in mid-conversation without disrupting communication.

While a particular embodiment of the invention has been described and shown, it will be understood by those of ordinary skill in the art that the present invention is not limited thereto since many modifications may be made. It is therefore contemplated by the present application to cover any and all such embodiments that may fall within the true spirit and scope of the basic underlying principles disclosed and claimed herein.

What is claimed is:

1. A low power digital receiver for recovering an information signal, comprising:
   means for bandlimiting a received signal to provide a bandlimited signal;
   means for converting said bandlimited signal to provide an intermediate frequency signal;
   means for filtering said intermediate frequency signal to provide a filtered signal, said filtering means having a bandwidth exceeding that of the information signal;
   means for adjusting the level of said filtered signal to provide a level adjusted filtered signal;
   means for generating at least two sampling signals;
   means for varying the sampling rate by selecting a particular one of said at least two sampling signals in response to a control signal, and for contemporaneously adapting said level adjusting means;
   means for sampling and digitizing said level adjusted filtered signal using said selected one of said at least two sampling signals to provide a digitized signal;
   means for processing said digitized signal to recover the information signal, and for generating said control signal in response to predetermined characteristics of said digitized signal.

2. The receiver of claim 1, wherein said generating means generates said sampling signals from a common clock source.

3. The receiver of claim 1, which includes means for controlling said sampling and digitizing means whereby said sampling and digitizing means is temporarily enabled to provide said digitized signal, and returned to a disabled state until a next sampling interval.

4. A low power digital receiver for recovering an information signal, comprising:
   means for bandlimiting a received signal to provide a bandlimited signal;
   means for converting said bandlimited signal to provide a first intermediate frequency signal;
   means for filtering said first intermediate frequency signal to provide a filtered signal, said filtering means having a bandwidth exceeding that of the information signal;
   means for adjusting the level of said filtered signal to provide a level adjusted filtered signal;
   means for generating at least two sampling signals from a common clock source;
   broadband sampling means for sampling said level adjusted filtered signal to provide a sampled signal comprising a second intermediate frequency;
   broadband digitizing means for digitizing said sampled signal to provide a digitized signal;
   means for controlling said level adjusting means and said broadband sampling and digitizing means such that the same are temporarily enabled to provide their respective signals;
   means for varying the sampling rate by selecting one of said at least two sampling signals in response to a control signal, and contemporaneously adapting said level adjusting means;
   means for processing said digitized signal to recover the information signal; and to generate said control signal in response to predetermined characteristics of said digitized signal;

5. The receiver of claim 4, wherein the frequency of said second intermediate frequency is approximately one-fourth the frequency of said sampling signal.

6. A method for recovering an information signal with a low power digital receiver, comprising the steps of:
   (a) bandlimiting a received signal to provide a bandlimited signal;
   (b) converting said bandlimited signal to provide a first intermediate frequency signal;
   (c) filtering said intermediate frequency signal in a filtering means having a bandwidth exceeding that of the information signal to provide a filtered signal;
   (d) generating at least two sampling signals;
   (e) selecting a particular one of said sampling signals in response to a control signal, and contemporaneously adjusting the level of said filtered signal to provide a level adjusted filtered signal;
   (f) sampling and digitizing said level adjusted filtered signal using said selected one the said sampling signals to provide a digitized signal;
   (g) processing said digitized signal to recover said information signal, and for generating said control signal in response to predetermined characteristics of said digitized signal such that the sampling rate is dynamically varied to properly recover the information signal while maintaining the lowest allowable sampling frequency thereby minimizing the power consumption of the receiver.

7. A method for recovering an information signal with a low power digital receiver, comprising the steps of:
   (a) bandlimiting a received signal to provide a bandlimited signal;
   (b) converting said bandlimited signal to provide a first intermediate frequency signal;
   (c) filtering said intermediate frequency signal in a filtering means having a bandwidth exceeding that of the information signal to provide a filtered signal;
   (d) generating at least two sampling signals;
   (e) selecting a particular one of said sampling signals in response to a control signal, and contemporaneously adjusting the level of said filtered signal to provide a level adjusted filtered signal;

(f) enabling, temporarily, a sampling and digitizing means for sampling and digitizing said level adjusted filtered signal using said selected one the said sampling signals to provide a digitized signal;

(g) processing said digitized signal to recover said information signal, and for generating said control signal in response to predetermined characteristics of said digitized signal such that the sampling rate is dynamically varied to properly recover the information signal while maintaining the lowest allowable sampling frequency thereby minimizing the power consumption of the receiver.

8. A method for recovering an information signal with a low power digital receiver, comprising the steps of:

(a) bandlimiting a received signal to provide a bandlimited signal;

(b) converting said bandlimited signal to provide a first intermediate frequency signal;

(c) filtering said intermediate frequency signal in a filtering means having a bandwidth exceeding that of the information signal to provide a filtered signal;

(d) generating at least two sampling signals;

(e) selecting a particular one of said sampling signals in response to a control signal, and adjusting the level of said filtered signal to provide a level adjusted filtered signal;

(f) sampling said level adjusted filtered signal using said selected one the said sampling signals to provide a sampled signal having a frequency approximately one-fourth that of said selected sampling signal;

(g) digitizing said sampled signal using said selected one the said sampling signals to provide a digitized signal;

(h) processing said digitized signal to recover said information signal, and for generating said control signal in response to predetermined characteristics of said sampled signal and said digitized signal such that the sampling rate is dynamically varied to properly recover the information signal while maintaining the lowest allowable sampling frequency thereby minimizing the power consumption of the receiver.

9. A method for recovering an information signal with a low power digital receiver, comprising the steps of:

(a) bandlimiting a received signal to provide a bandlimited signal;

(b) converting said bandlimited signal to provide a first intermediate frequency signal;

(c) filtering said intermediate frequency signal in a filtering means having a bandwidth exceeding that of the information signal to provide a filtered signal;

(d) generating at least two sampling signals;

(e) selecting a particular one of said sampling signals in response to a control signal, and adjusting the level of said filtered signal to provide a level adjusted filtered signal;

(f) enabling, temporarily, a sampling means for sampling said level adjusted filtered signal using said selected one the said sampling signals to provide a sampled signal having a frequency approximately one-fourth that of said selected sampling signal;

(g) enabling, temporarily, a digitizing means for digitizing said sampled signal using said selected one the said sampling signals to provide a digitized signal;

(h) processing said digitized signal to recover said information signal, and for generating said control signal in response to predetermined characteristics of said sampled signal and said digitized signal such that the sampling rate is dynamically varied to properly recover the information signal while maintaining the lowest allowable sampling frequency thereby minimizing the power consumption of the receiver.

* * * * *

UNITED STATES PATENT AND TRADEMARK OFFICE
CERTIFICATE OF CORRECTION

PATENT NO. : 4,811,362

DATED : March 7, 1989

INVENTOR(S) : Yester, Jr. et al.

Page 1 of 2

It is certified that error appears in the above-identified patent and that said Letters Patent is hereby corrected as shown below:

Col. 1, line 66, "resent" should be --present--.

Col. 2, line 15, "senstitivity" should be --sensitivity--.

Col. 3, line 28, "analog-to-digtial" should be --analog-to-digital--.

Col. 3, line 35, insert --of the-- between "($f_s$)" and "present".

Col. 4, line 27, "intermodualation" should be --intermodulation--.

Col. 4, line 28, "senstitivity" should be --sensitivity--.

Col. 4, line 48, "senstitivity" should be --sensitivity--.

Col. 5, line 4, "decease" should be --decrease--.

Col. 5, line 49, "frequencies)" should be --frequencies).--.

Col. 5, line 60, "the" should be --then--.

Col. 5, line 67, "degrade" should be --degrades--.

Col. 6, line 30, "MHZ" should be --MHz--.

Col. 6, line 35, "MHZ" should be --MHz--.

Col. 7, line 13, "minimizing" should be --minimize--.

Col. 8, line 19, "signal;" should be --signal,--.

UNITED STATES PATENT AND TRADEMARK OFFICE
CERTIFICATE OF CORRECTION

PATENT NO. : 4,811,362

DATED : March 7, 1989

INVENTOR(S) : Yester, Jr. et al

It is certified that error appears in the above identified patent and that said Letters Patent is hereby corrected as shown below:

Col. 8, line 21, "signal;" should be --signal.--.

Signed and Sealed this

Twenty-second Day of May, 1990

Attest:

HARRY F. MANBECK, JR.

*Attesting Officer*  *Commissioner of Patents and Trademarks*